United States Patent [19]

Corrao et al.

[11] Patent Number: 4,680,568

[45] Date of Patent: Jul. 14, 1987

[54] ELECTRICAL COMPONENT HAVING FUSE ELEMENT, AND METHOD OF USING SAME

[75] Inventors: Mark Corrao, Wyoming, Mich.; David T. Shaffer, Harrisburg, Pa.

[73] Assignee: AMP Incorporated, Harrisburg, Pa.

[21] Appl. No.: 857,204

[22] Filed: Apr. 29, 1986

[51] Int. Cl.⁴ .................... H01H 85/02; H01H 85/14
[52] U.S. Cl. .................... 337/186; 337/189; 337/256; 361/104; 29/623
[58] Field of Search ............. 337/11, 186, 187, 188, 337/189, 221, 216, 256; 361/104; 29/623; 338/195

[56] References Cited

U.S. PATENT DOCUMENTS 4,364,006 12/1982 Makabe et al. .................... 338/195
4,547,830 10/1985 Yamauchi .......................... 337/160

OTHER PUBLICATIONS

AMP Instruction Sheet IS 7768 (1977) "AMP Programmable Shunts for Dual-In-Line Package (DIP) Applications" (AMP Incorporated, Harrisburg, Pa.).

Primary Examiner—Harold Broome
Attorney, Agent, or Firm—Anton P. Ness

[57] ABSTRACT

An electrical component has a plurality of paired contacts with spaced inner contact sections bridged by a fuse element. The paired contacts have outer contact sections enabling mounting to a circuit panel to complete circuit paths thereon. The component can be used as a shunt for programming the circuit panel by programming the component prior to in-service use of the panel, by the method of deliberately opening the respective fuse element between one or more selected pairs of contacts by an electrical programming current thereon, leaving other fuse elements intact for in-service path connection of their respective circuit paths. The component can be surface mountable and can have DIP configuration.

10 Claims, 8 Drawing Figures

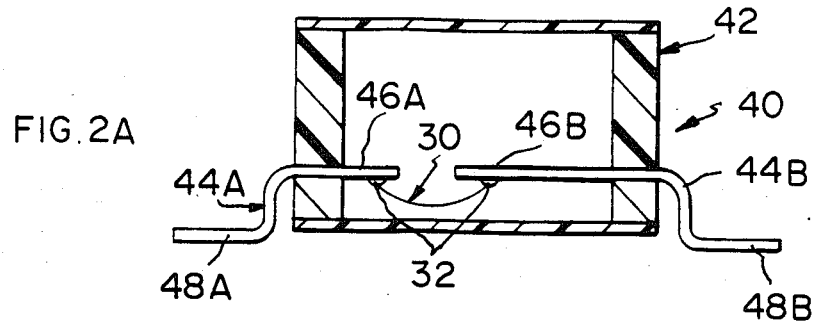
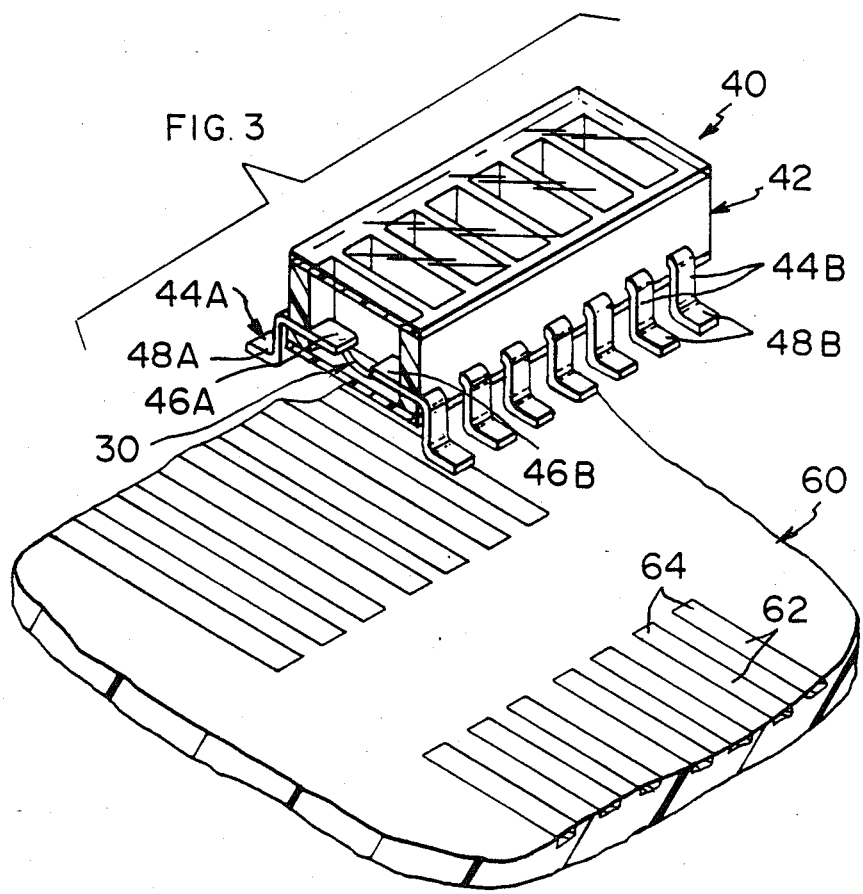

ELECTRICAL COMPONENT HAVING FUSE ELEMENT, AND METHOD OF USING SAME

The present invention is related to the field of electrical components, and more particularly is related to the field of shunts for circuit panels.

BACKGROUND OF THE INVENTION

Shunts for circuit panels are known which have a plurality of pairs of contacts for completing circuit paths of a circuit panel, where it is desired to program the circuit panel by bringing at least a selected one of the circuit paths into a closed condition by a corresponding electrically joined pair of contacts. Programming of the shunt to program the circuit panel by opening a selected circuit path is accomplished by physical breaking of the strap electrically connecting the particular pair of contacts in the shunt corresponding to that path, as known from the DIP shunt sold by AMP Incorporated of Harrisburg, Pa. under Part No. 435704-5. Such a shunt cannot be sealed, because the aperture must remain open to receive the strap-breaking tool. Also and more importantly close spacing of the contact pairs is not feasible due to the need for adequate lateral spacing to receive the tool for assured breaking of only the selected strap and not adjoining ones. An improved method of creating a discontinuity between a selected pair of contacts is desired not requiring tool insertion.

SUMMARY OF THE INVENTION

The electrical component of the present invention has pairs of contacts having outer contact sections electrically engageable with contact sections of circuit paths of a circuit panel such as a circuit board or a flexible panel. Inner contact sections are in spaced pairs in respective cavities of the housing and are bridged by a fuse element secured thereto in electrical engagement therewith. The fuse element has a selected in-service current-carrying capability corresponding with that of the circuit path whose circuit it completes upon the components being secured to the circuit panel, and also has characteristics selected to cause opening of the fuse upon application of a designed electrical programming current by melting due to heat buildup from high resistance due to the small diameter.

According to one method of using the electrical component of the invention, the component serves as a programmable shunt for programming the circuit panel. The outer contact sections corresponding to the circuit path desired to be an open path, have applied thereto a designed programming current prior to mounting the component to the circuit panel. Programming current can also be applied after mounting the component to the panel by applying it to the circuit path desired to be opened, which may be done prior to mounting the thus-programmed circuit panel into its ultimate in-service site. Such applied programming current opens the corresponding fuse element and breaks the electrical connection between the inner contact sections.

According to other aspects of the electrical component of the present invention the contacts can be insert molded in the housing, the cavities of the housing containing the fused inner contact sections can be sealed, and the outer contact sections can be disposed in a dual in-line arrangement and can either comprise vertical legs for insertion into panel holes and soldered to conductive pads of the circuit paths or can have horizontal sections for surface mounting to conductive pads of the circuit paths. The fuse element can be welded, bonded or crimped to the inner contact sections and can comprise a length of fine wire such as 0.0015 inch diameter constantan or copper alloy wire, or 0.0007 inch diameter aluminum wire.

BRIEF DESCRIPTION OF THE DRAWINGS

FIG. 2A is similar to FIG. 2 representing an alternate embodiment of securing the fuse element, and of the outer contact sections.

FIG. 3 is a perspective view showing a segment of a flexible circuit panel having conductive pads for surface mounting of the embodiment of the electrical component of FIG. 2A.

DETAILED DESCRIPTION OF THE INVENTION

Figure 1:
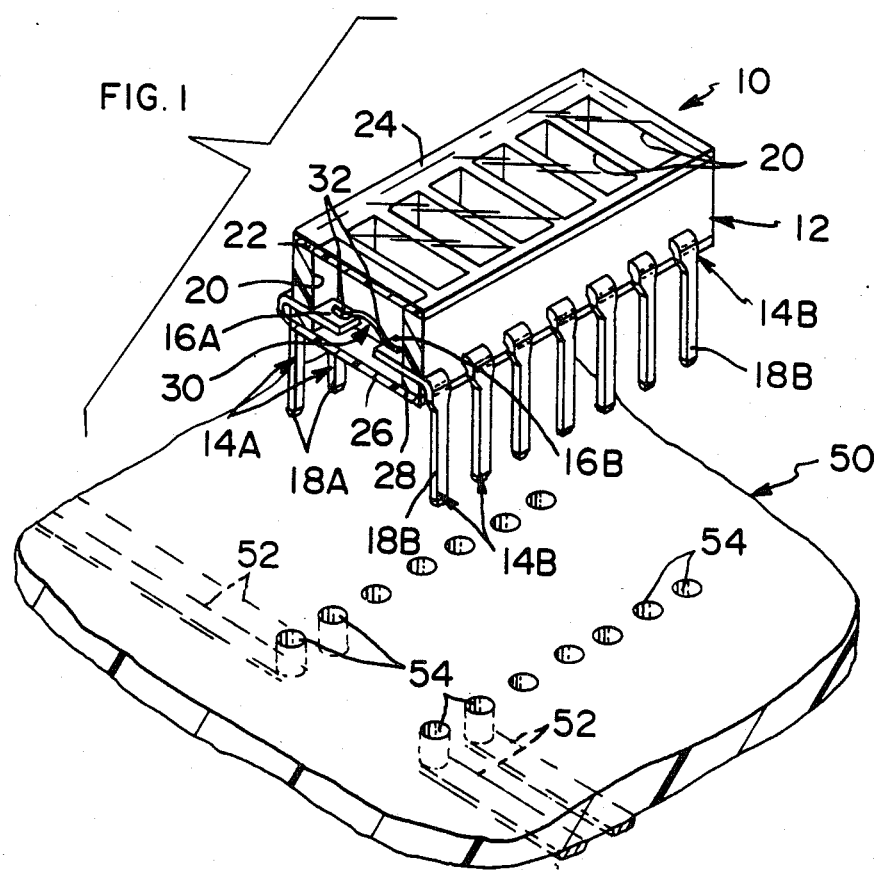
FIG. 1 is a perspective view of the electrical component of the invention exploded from a printed circuit board with a housing end wall portion broken away.
Figure 2:
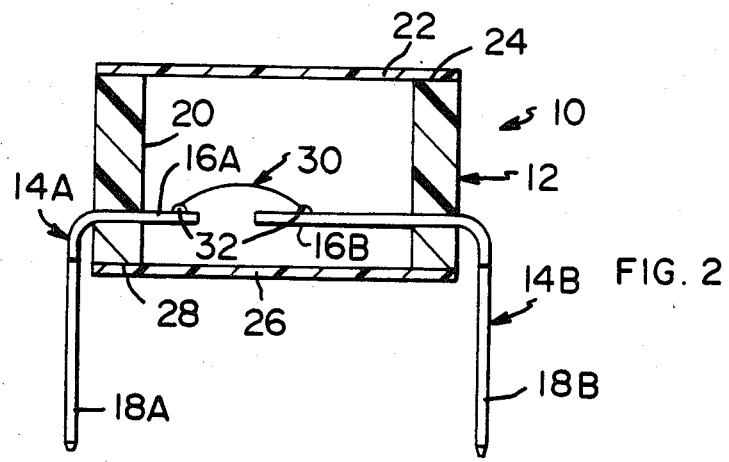
FIG. 2 is a cross-sectional view taken along lines 2—2 of FIG. 1.
Figure 4A:
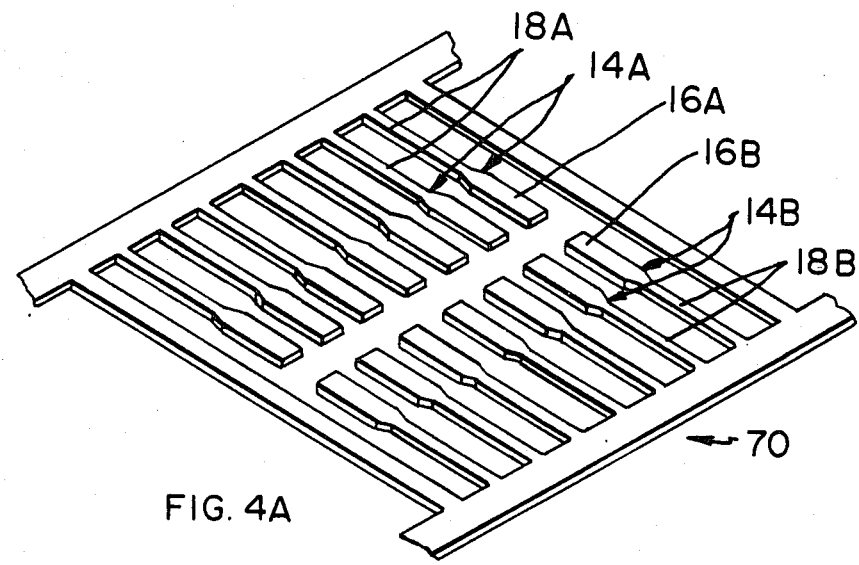
FIGS. 4A-4D are perspective views illustrating sequentially one method of making the electrical component of FIG. 1.
Figure 4B:
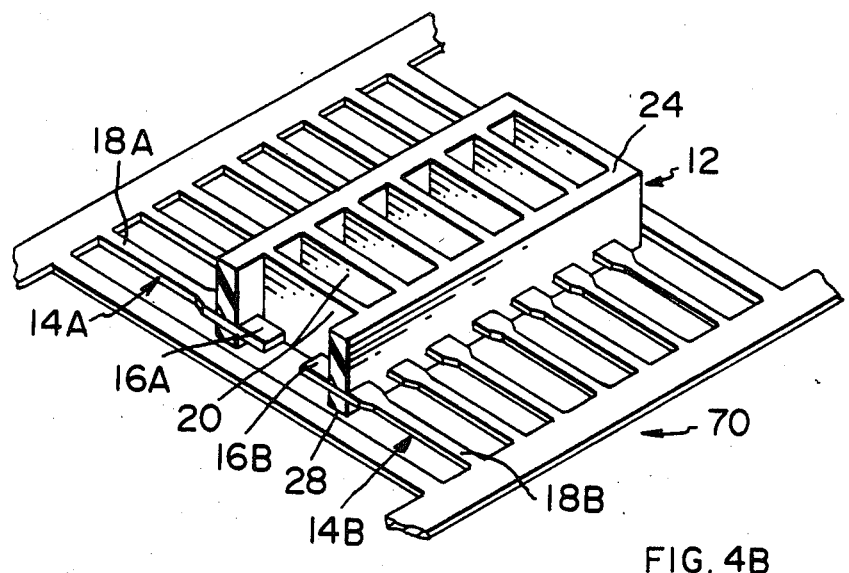
Figure 4C:
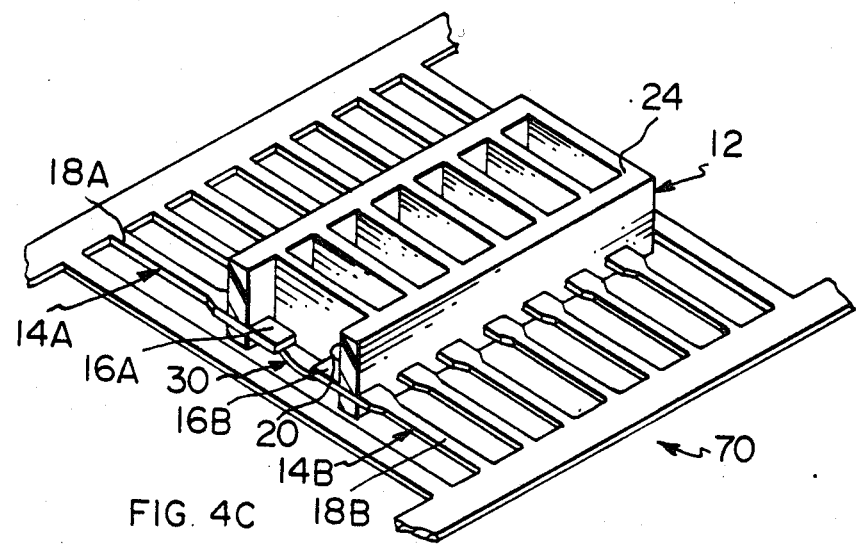
Figure 4D:
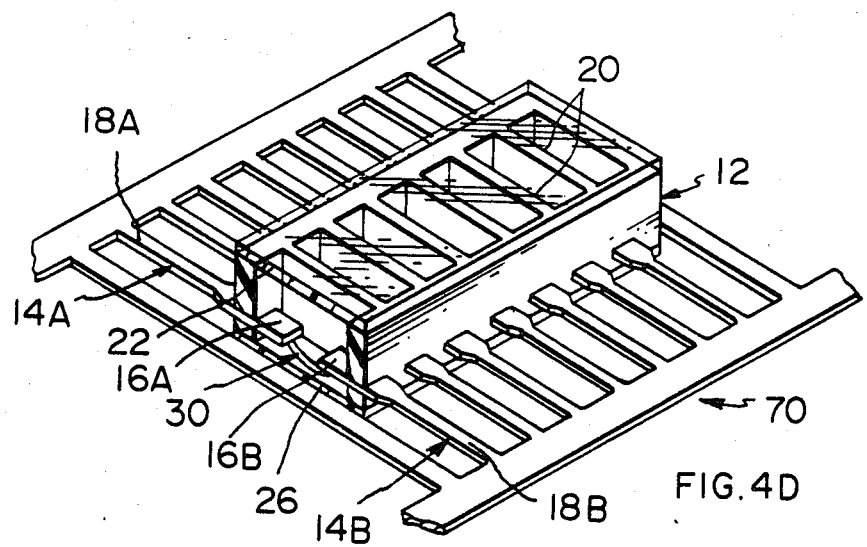

FIGS. 1 and 2 show the electrical component 10 of the present invention having a housing 12 and a plurality of pairs of contacts 14A,14B spaced therealong preferably in a dual in-line arrangement. Each contact 14A has an innner contact section 16A spaced proximate an inner contact section 16B of its corresponding contact 14B. A fuse element 30 extends between the pair of inner contact sections 16A,16B and is mechanically secured thereto at joints 32 in electrical engagement therewith. Each of the pair of contacts 14A,14B also has an outer contact section 18A,18B respectively for electrical engagement with a corresponding contact means of an elecrical circuit path on a circuit panel. Fused inner contact sections 16A,16B are preferably disposed in respective cavities 20 of housing 12. The electrical component is preferably sealed by securing a sealing member 22 to the top 24 of housing 12 and a sealing member 26 to the bottom 28 of the housing. Outer contact sections 18A,18B are vertical leg sections for insertion into holes 54 which form part of the circuit paths 52 on a rigid circuit panel such as a printed circuit board 50. The fuse element 30 is preferably secured for performance reasons to the top surfaces of inner contact sections 16A,16B and arced upwardly away from the ends of the contact sections.

FIG. 2A illustrates an alternate embodiment where fuse element 30 is secured by joints 32 to bottom surfaces of the inner contact sections 46A,46B of contacts 44A,4B, in housing 42 of component 40. Because the walls of the housing must have a height sufficient to enable handling by automated handling apparatus for positioning on a circuit panel, it is easier during fabrication of the fuse shunt to secure the fuse element 30 to the bottom surfaces of contact sections 46A,46B which are proximate the bottom face of the fuse shunt. Contacts 44A,44B include outer contact sections 48A,48B which comprise a pair of coplanar horizontally extending sections, for surface mounting to conductive pads 64 of the circuit paths 62 on the surface of a circuit panel, such as flexible circuit panel 60 as shown in FIG. 3.

The fuse element is secured to the inner contact sections such as by conventional resistance welding or wire bonding techniques to form joints 32. Another method of joining the fuse element is disclosed in U.S. patent application Ser. No. 857,209 filed Apr. 29,1986. In that method the fuse element is a wire segment first disposed in a groove skived axially along the inner contact sections and then terminated by deforming portions of the inner contact sections forming sidewalls of the groove over the top of the wire at at least one location on each inner connect section by means of a terminating tool. Various methods based on conventional techniques may be used so long as heat is not generated in sufficient amounts to inadvertently open or damage the fuse element which is fragile requiring care in handling and processing.

It is believed preferable to secure the fuse element to the pair of contact sections after securing the contacts in the housing, so that the housing provides mechanical stability and enhances physical protection of the fragile wire fuse element during fabrication as is shown in FIGS. 4 A to 4C. While joined to a carrier strip 70, the contacts 14A,14B are preferably placed in a mold and a dielectric housing 12 molded thereto by conventional insert molding techniques, as shown in FIG. 4B. The fuse elements 30 are then secured to respective contact sections, as in FIG. 4C. Thin, transparent sealing membranes 22,26 are then preferably adhered to the top and bottom surfaces 24,28 respectively of housing 12 completing the manufacture of the electrical component, as in FIG. 4D. The completed components can then be severed from the carrier strip and the outer contact sections 18A,18B formed into the desired configuration. The contacts 14A,14B are preferably stamped from a strip of copper alloy, and outer contact sections 18A,18B may be tin-lead plated for solderability. Housing 12 may be formed of a thermoplastic material such as glass-filled polyester resin. Sealing membranes 22,26 may be MYLAR (trademark of E. I. du Pont de Nemours and Company).

Fuse element 30 is preferably a wire segment of a selected very small diameter creating high resistance, and may be any of several conventional types of conductive metals such as high copper content alloy, aluminum, silver alloy, or constantan. The proper material to be used, and the actual diameter selected depend on the type of current desired to be carried by the fuse during normal in-service use and also the designed programming current for opening the fuse element. For example, a satisfactory fuse element can be a short length of aluminum wire having a diameter of 0.0007 inches if it is desired that the fuse carry an in-service current of 0.100 amperes and open upon receiving a programming current of 1.0 amperes for 100 milliseconds or less. A satisfactory fuse element can be a short length of constantan alloy having a diameter of 0.0015 inches for the same in-service and programming currents.

The fuse element opens by melting upon sufficient heat buildup resulting from the programming current passing through its very small diameter, and limited length for sufficient time. It is possible to estimate an appropriate small diameter for the fuse element when the following items are known: the programming current ($I_p$) and programming time (t), length of the fuse (L), ambient temperature ($T_a$), and metal alloy being used for the fuse. Characteristic properties of the metal alloy are ascertained: melting temperature $T_m$, specific heat (Cp), latent heat of fusion ($Q_f$), resistivity ($\rho$), and specific gravity (SG).

The heat required to melt the fuse is related to the fuse element dimensions and properties as follows:

$$\text{HEAT} = \text{MASS} \times [(T_m - T_a)C_p + Q_f] \quad (1)$$

where the mass of the fuse element is $$\text{MASS} = \left[\frac{\pi D^2}{4}\right][L][SG]. \quad (2)$$

The power generated by the current through the fuse is $$\text{POWER} = I_p^2 R \quad (3)$$

where $$R = \rho 4L/\pi D^2 \quad (4)$$

and the power and heat to melt are related to each other as:

$$\text{HEAT} = \text{POWER} \times t \quad (5)$$

EXAMPLES

Where two metal alloys are considered, constantan and aluminum, their characteristic values are as follows:

TABLE 1

|  | Constantan | Aluminum |
| --- | --- | --- |
| SG (specific gravity) | 0.323 lb/ft$^3$ | 0.0975 lb/ft$^3$ |
| $T_m$ (melting temperature) | 2210° F. | 660° F. |
| Cp (specific heat) | 0.098 Btu/lb/°F. | 0.215 Btu/lb/°F. |
| $Q_f$ (latent heat of fusion) | 100 Btu/lb | 170 Btu/lb |
| $\rho$ (resistivity) | 374 Ω mil$^2$/ft | 20.37 Ω mil$^2$/ft |

Typical values for the remaining variables, relevant to the present invention and its purpose and typical environment, are:

TABLE 2

| $I_p$ (programming current) = | 1.0 amperes |
| --- | --- |
| t (programming time) = | 100 milliseconds |
| L (fuse length) = | 0.10 inches |
| $T_a$ (ambient temperature) = | 75° F. |

Because adjacent contact structure at the terminations 32 of the ends of fuse element 30 is at theoretical ambient temperature, the contacts act as heat sinks and absorb some of the heat from the fuse element during programming. Other matters affecting programming are dimensional variations in the diameter of the fuse elements from fabrication thereof, surface contamination thereon, and the fuse length between terminations.

It is believed that successful programming of a fuse shunt may be accomplished using fuse elements of the metals given above at the stated length and programming current and time at the following diameters:

D constantan = 0.0015 inches

D aluminum = 0.0007 inches

Unprogrammed (unopened) fuse elements at such diameters are believed will successfully carry in-service currents of 100 milliamperes.

To avoid interfering with the opening of the fuse elements, the element 30 should be preferably spaced away from the ends of the inner contact sections 16A,16B and also from any of the structure of the housing 12 or seals 22,26 which would act to dissipate heat otherwise needed to melt the fuse. The seals 22,26 serve to physically protect the fragile fuse elements 30, and contain any vapors give off during the fuse melting and avoid possible contamination of nearby circuitry or components outside of component 10.

What is claimed is:

1. An electrical component mountable to an electrical article to complete at least one of a plurality of circuit paths thereon, comprising:

a housing means;

a like plurality of pairs of opposing contact means secured in said housing means, each of said contact means having an outer contact section extending outwardly from said housing means and matable to a corresponding contact means of said article and further havng an innner contact section spaced from the inner contact section of the associated other of said contact means; and a fuse element associated with each said pair of contact means mechanically and electrically secured to and between said inner contact sections thereof, the fuse element between the inner contact sections of at least a selected one of said pairs of contact means having been opened by being melted by a selected programming current applied to said at least one selected pair of contact means prior to mounting to said electrical article to retain the associated at least one said circuit path in an open condition, whereby said component is programmed, and said article is programmed by said component mounted thereto.

2. An electrical component as set forth in claim 1 wherein said housing means contains more than one pair of said contact means, and the fuse element between the inner contact sections of a selected one of said pairs of contact means is opened by being melted by a selected programming current applied to said selected pair of contact means prior to mounting to said printed circuit board to retain the associated said circuit path in an open condition, whereby said component is programmed, and said circuit panel is programmed by said component mounted thereto.

3. An electrical component as set forth in claim 1 wherein said outer contact sections are disposed in a dual in-line arrangement.

4. An electrical component as set forth in claim 1 wherein said outer contact sections are vertical legs disposed in parallel pairs for insertion into corresponding receiving means of said circuit paths of said article.

5. An electrical component as set forth in claim 1 wherein said outer contact sections have horizontally extending sections for surface mounting to corresponding to pad means of said circuit paths of said article.

6. An electrical component as set forth in claim 1 wherein said cavity means is sealed.

7. An electrical component as set forth in claim 1 wherein said housing means is molded to said pairs of contact means.

8. A method of making a programmed electrical component having multiple pairs of contact means each defining a component circuit path, comprising the steps of:

selecting contact means having inner contact sections and outer contact sections;

arranging said contact means in pairs having said inner contact sections thereof disposed proximate each other;

securing a fuse element to each said pair of inner contact sections in mechanical and electrical engagement therewith, each said fuse element electrically conductive of a selected in-service electrical current;

securing said fused pairs of contact means in a housing means such that said fused inner contact sections are disposed in a cavity means and said outer contact sections extend outwardly from said housing means, forming said electrical component;

selecting at least one said fused pair of contact means to correspond with at least one circuit path of an electrical article desired to be an open circuit; and opening said fuse element of said at least one pair of contact means by applying to said outer contact sections of said pair of contact means a selected electrical programming current exceeding said selected in-service current, thereby programming said electrical component.

9. A method as set forth in claim 8 wherein said opening step is performed on said at least one pair of contact means, by mounting said component to said article with said outer contact sections of said at least one pair of contact means in engagement with said at least one article circuit path and applying said electrical programming current to said article circuit path and electrically across said pair of contact means.

10. A method as set forth in claim 8 comprising the further step, after said step of securing said fused pairs of contact means in said housing, of sealing said cavity means of said housing means.

* * * * *